United States Patent [19]

Diguet

[11] 3,940,784
[45] Feb. 24, 1976

[54] SEMICONDUCTOR DEVICE
[75] Inventor: Daniel Diguet, Caen, France
[73] Assignee: U.S. Philips Corporation, New York, N.Y.
[22] Filed: May 3, 1974
[21] Appl. No.: 466,627

[30] Foreign Application Priority Data
May 4, 1973  France .............................. 73.16132

[52] U.S. Cl. ..................... 357/20; 357/16; 357/48; 357/17; 357/61
[51] Int. Cl.² ................ H01L 29/06; H01L 29/161
[58] Field of Search .............. 357/48, 20, 16, 61, 17

[56]  References Cited
UNITED STATES PATENTS
3,529,217  9/1970  Van Santen .................... 317/235

Primary Examiner—Martin H. Edlow
Attorney, Agent, or Firm—Frank R. Trifari; Leon Nigohosian

[57] ABSTRACT

A semiconductor device having a monocrystalline semiconductor layer provided on a surface comprising at least one region obtained by diffusion of a doping impurity whose width from the surface of the semiconductor layer in the direction of the substrate first increases and than decreases while the chemical composition of the semiconductor layer on the substrate side differs from that at the surface.

20 Claims, 3 Drawing Figures

SEMICONDUCTOR DEVICE

The invention relates to a semiconductor device comprising a monocrystalline semiconductor layer which is provided on a substrate and in which at least one semiconductor circuit element is formed, which semiconductor layer comprises at least one region obtained by diffusion of a doping impurity, in which the width of said region, from the surface of the semiconductor layer in the direction of the substrate, locally increases and then decreases.

It is known that the diffusion of the impurities in a homogeneous monocrystalline semiconductor layer occurs in an isotropic manner.

The diffusion in the direction parallel to the surface is often undesired in cases where said diffusion restricts the miniaturisation of semiconductor devices having a large density of circuit elements, for example, in integrated circuits. The extent of said lateral diffusion at the surface determines at least partly the distance between adjacent components.

One of the objects of the invention is to manufacture monocrystalline semiconductor layers in which the diffusion of impurities in directions parallel to the surfaces of said layers, that is to say the lateral diffusion, can be restricted.

The invention is inter alia based on the use of the variation of the diffusion rate in a given semiconductor material as a function of the chemical composition of said material.

According to the invention, a semiconductor device of the type mentioned in the preamble is characterized in that the chemical composition of the semiconductor material of the layer on the side of the substrate differs from that at the surface. It was found that, in particular, an increased diffusion rate may occur in areas in which variations of the chemical composition of the semiconductor material are present.

For example, a diffused region may be formed in such a layer by local diffusion of a doping impurity from the surface of the monocrystalline semiconductor layer, said region having a cross-sectional shape of a pear. This shape is especially obtained in case of a gradual variation of the composition of the semiconductor material over at least part of the thickness of the layer.

Such a shape of the circumference of the diffused region is very advantageous; in case a certain minimal depth of the diffused region is required, said shape results in a minimum width of the diffused region in the immediate vicinity of the surface of the layer, that is to say at a level where generally most active or passive components of an integrated semiconductor device are formed. Said width at the layer surface may be especially small when, according to a preferred embodiment, the compositions in the layer are such, that, at a given temperature, the diffusion coefficient of the doping impurity in the semiconductor material of the layer is larger on the substrate side than at the surface.

In the case of a diffusion of insulating walls which serve for mutually separating islands in the layer in which islands afterwards separate circuit elements or combinations thereof are provided, the invention enables an increase of the effective area for said circuit elements and hence of their density per unit of surface area.

Another advantage of diffusion "in the form of a pear" is that, according to a preferred embodiment, it opens the possibility of interconnecting two or a larger number of adjacent diffused regions in the depth of the layer and thus the creation of islands in the said layer, which islands are entirely separated from each other and from the substrate by the said regions. This may be interesting in the case in which deep portions of the layer show structure faults which may cause electrical difficulties, for example, a poor insulation with the substrate supporting said layer. Furthermore, the nature, the structure or the electrical properties of the said substrate are less important.

It is often desirable to form semiconductor circuit elements in an area of constant composition. Also in such a case the invention may be applied by using a layer portion of constant composition at the surface of the layer, the composition variation proceeding from a certain depth underneath the surface downwards. The diffusion for forming the said pear-shaped region should be carried out through the upper layer portion of constant composition. In order to form semiconductor circuit elements one or more shallow diffusions may be carried out for forming at least one pn-junction entirely situated within the material of constant composition.

The method of manufacturing the semiconductor device according to the invention which also forms part of the said invention, is characterized in that an epitaxial semiconductor layer is deposited on an monocrystalline substrate, the composition of the depositing material being varied at least temporarily, a doping impurity being then diffused locally from the surface of the epitaxially deposited layer at least down to a depth where the composition of the semiconductor material varies.

Preferably the composition of the depositing material is gradually varied at least temporarily.

According to a further preferred embodiment the variation is carried out from a composition having a larger diffusion coefficient for the doping impurity to a composition having a smaller diffusion coefficient for said impurity when measured at the same temperature. In this manner the lateral diffusion in the semiconductor material immediately underneath the surface is lower than the diffusion according to a direction normal to the plane of the layer, that is tosay the vertical diffusion. Using the same temperature and time conditions, the same impurity which is diffused from the surface of the monocrystalline layer follows a track in said layer which is shorter according as its direction of movement encloses a smaller angle with the surface.

The result is that the width of the diffused region in the vicinity of the surface of the layer is small compared with what said width would be with the same depth of vertical diffusion if the lateral diffusion rate were as large as the vertical diffusion rate. Due to the method according to the invention a better positioning of the diffused regions at the surface is thus obtained so that the number of possible components in said layer can be larger.

Of course, the use of the invention makes it desirable to make a suitable choice of the impurity or of the impurities to be diffused in accordance with a suitable choice of the nature of the layer and the variation of the composition of said layer in its direction of thickness, it being possible to suitably combine the parameters so as to obtain the desired diffusion in the form of a pear. Evidently the compositions in the layer and the doping impurity are to be chosen such that it is possible to choose a suitable temperature for diffusing said impurity in the various materials applied whereas none of the semiconductor materials may form a melt at said temperature. For example, it is not well possible to diffuse the well-known donors of Group V and the acceptors of Group III of the Periodic Table of the elements into silicon at a temperature below the melting temperature of germanium. In principle, however, it may be possible to choose a limited composition range within the continuous range of compositions from elementary germanium until elementary silicon in which such an impurity may be diffused at a certain temperature in all materials having compositions within said limited composition range.

For a layer comprising, for example, ternary compositions according to the formula $AB_{1-x}C_x$, wherein A, B and C denote three chemical elements which can be united in the binary compounds AB and AC, which layer is provided epitaxially on a binary substrate consisting of the compound (AB), the doping impurity is preferably chosen to be so that its diffusion rate, at a given temperature, is larger in the binary compound AB than it is in the binary compound AC. In principle, the diffusion rate from the surface of the layer of the compound $AB_{1-x}C_x$ may become larger according as the formula of said compound tends to AB, that is to say, that the diffusion rate can increase in principle according as the content of the element C in the said composition becomes lower.

In a preferred embodiment, a layer consists of semiconductor material of the III–V type having compositions of elements of the type $A^{III}$, $B^V$ and $C^V$, in which $B^V$ and $C^V$ may be phosphorus and arsenic, for example, indium, phosphorus and arsenic, which layer may be obtained by epitaxial growth from a substrate consisting of a binary compound of the type $A_{III}B_V$, for example indiumarsenide (InAs). At the surface the ternary compound has a composition which, according to said example, may be given by the formula $InAs_{1-x}P_x$. The diffusion rate of impurities such as zinc, cadmium or beryllium, becomes larger from the surface of the layer to the substrate because zinc, cadmium or beryllium have diffusion rates which are larger in indium arsenide than in indiumphosphide (InP). The invention has also been carried out successfully with compositions within the range GaAs–GaP.

The invention will be described in greater detail with reference to the accompanying drawing in which the figures show diagrammatically parts of semiconductor devices according to embodiments of the invention.

It is to be noted that, for clarity, the correct dimensions and proportions are not respected in the various figures, in particular not in the direction of the depth of the semiconductor device.

Figure 1:
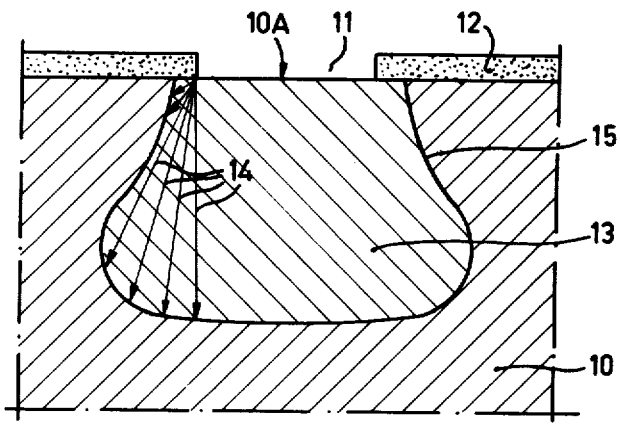
FIG. 1 is a cross-sectional view showing diagrammatically the shape of a pair which is typical of a diffusion which has taken place from the surface in a semiconductor layer having a composition according to the invention.

FIG. 1 shows a part of a semiconductor layer 10 which is composed of at least two chemical elements which form a mixed crystal at least in a part of the layer, it being assumed that said layer shows no structural defects.

A given impurity has been diffused in the layer 10 from the surface 10A of said layer and via a window 11 in a masking layer 12 which otherwise covers the said layer 10 so as to form the diffused region 13.

According to this embodiment of the invention the chemical composition of the layer 10 varies as a function of the thickness of the said layer and the variation in question is such that the diffusion rate of the chosen impurity becomes larger from the surface 10A in the direction of the depth.

In the case which has been taken as an example for FIG. 1 the variation of the composition of the layer 10 is gradual. The various factors 14 show in different directions which are followed on an average by impurity atoms the maximum range of an impurity in a given diffusion time and in given circumstances. It is obvious that, if the requirements to be imposed according to the invention are satisfied in the choice of the composition of the layer and of the nature of the impurity, the modulus of a vector 14 is the larger according to its direction encloses a larger angle with the surface 10A. In a diffusion direction parallel to the surface 10 the diffusion range is minimum and in a diffusion direction normal to the surface 10A the diffusion range is maximum.

For a composition of the layer 10 with gradual variation, the boundary 15 of the vectors 14 (which corresponds to the shape of the boundary of the diffused region 13) has the shape of a pear as is shown in FIG. 1. In agreement with the principle of the invention, the width of the region 13 from the surface 10A in the direction of depth first increases and then decreases.

For more abrupt composition variations of the layer 10 obtained in successive steps, instead of gradual composition variations, but also according to the principle underlying the invention, the shape of the boundary 15 would be more irregular but just as in the case of the pear shape the lateral diffusion rate on an average is smaller than the vertical diffusion rate.

An advantage of obtaining a diffused region 13 with a shape as shown in FIG. 1 will be explained with reference to FIG. 2.

Figure 2:
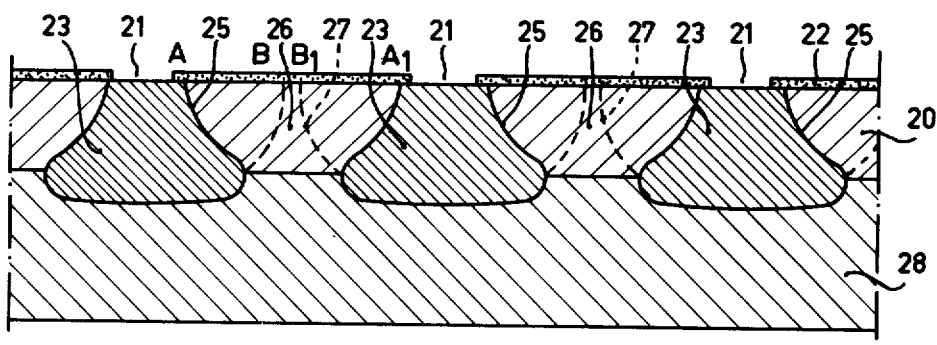
FIG. 2 is a diagrammatic cross-sectional view which shows the case of the formation of insulating walls which bound islands in a semiconductor layer which are separated from each other, in which space saving has been obtained by using compositions of the said layer according to the invention.

This FIG. 2 relates, by way of example, to the case of the formation of mutually insulated islands in a semiconductor layer by local diffusion from the surface of said layer.

The semiconductor layer 20 which is to be divided into islands, is provided, for example, epitaxially on a substrate 28. The various chemical compositions of the layer 20 when a given impurity to be diffused is used satisfies the requirements of the invention.

Diffusion windows 21 have been manufactured in a masking layer 22 on the semiconductor surface.

With the diffusion process, regions 23 are formed the boundaries 25 of which have the shape of a pear as explained above, which regions 23 extend through the layer 20 down to in the substrate 28. The regions 23 form insulating walls which separate the islands 26 in the layer 20 from each other.

The same FIG. 2 shows in broken lines 27 the lateral boundary of the diffused regions in the case in which the layer 20 would have a given fixed composition throughout its thickness in which the diffusion would occur in an isotropic manner. Since the lateral diffusion rate in this latter case would be equal to the vertical diffusion rate, a strong reduction of the volume of each island 26 would be obtained for the same axial distance between two adjacent diffused regions. Whereas upon using a layer having a variable molecular composition according to the invention the horizontal distance at an island surface of the layer 10 between two adjacent insulating walls 23 is equal to $AA_1$, said horizontal distance would be reduced to $BB_1$ in the case of a layer of a fixed molecular composition through the thickness.

The use of the measures according to the invention makes it possible, for example, with a given diffusion depth either to manufacture islands 26 having a larger effective area, or to arrange said islands closer together. By means of the invention a larger density of effective spaces can be obtained and miniaturisation can be stimulated.

Figure 3:
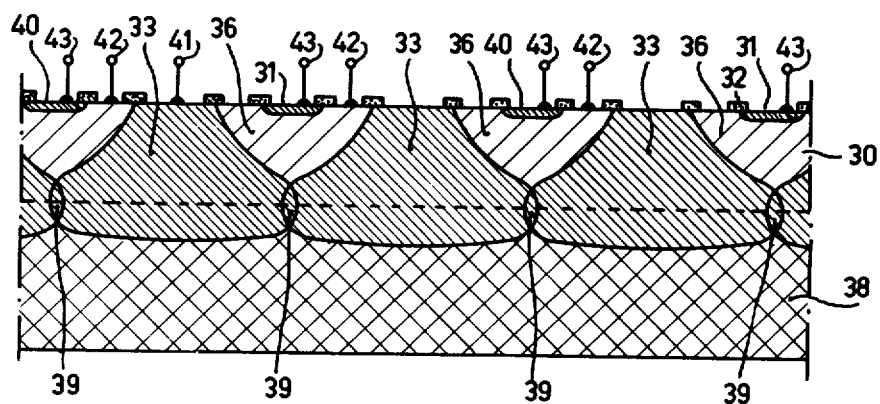
FIG. 3 is a diagrammatic cross-sectional view of a type of structure which can be realized by using a semiconductor layer having a composition according to the invention.

FIG. 3 shows by way of example an embodiment of the semiconductor device according to the invention in which a very good insulation of islands is obtained which have been provided in an active semiconductor layer on the one hand between the said same islands mutually and on the other hand with the underlying substrate supporting the said active layer.

For example, as in the structure shown in FIG. 2, said active layer 30 is an epitaxial layer which is deposited on a substrate 38. In the present case the substrate 38 may be of the p-conductivity type, whereas the layer 30 is of the n-conductivity type; it is obvious that this choice is not limitative of the present invention. In contrast with the case described with reference to FIG. 2, the conductivity type of the semiconductor substrate 38 need in this case not be opposite to the conductivity type of the epitaxial semiconductor layer 30.

Regions which form insulating walls 33 which separate the islands 36 in the layer 30 from each other have been manufactured in the epitaxial layer 30 via windows in a diffusion mask layer 32 by diffusion of a p-type impurity. By using measures within the scope of the invention, as regards the varying chemical composition of the layer 30 and the choice of the diffused impurity for the separation walls 33, the said walls at their bases have widths which are larger than their widths at the surface of the said layer 30 in which they roughly have a pear-like cross-section.

In the structure shown in FIG. 3 the diffused regions or insulating walls 33 mutually contact each other in common buried zones 39 in the depth of the layer 30, said zones extending down to in the substrate 38 where the diffused impurity also penetrates.

Said types of structure in which a complete insulation of the islands 36 by the regions 33 is obtained implies for a layer 30 of a given nature and a given diffusion impurity a maximum pitch between the diffusion windows for the formation of the regions 33 combined with a minimum thickness of the layer 30 to enable the formation of the common buried zones 39 in the said layer 30.

The connections of the insulating regions with the common buried zones 39 make it possible to prevent that the islands 36 extends in the depth down to in the deep parts of the layer 30 adjoining the substrate 38.

Said deep parts of the layer 30 have a considerably disturbed crystal structure, often inherent in a junction structure between two materials, in this case the materials of the substrate 38 and of the layer 30, with generally different lattice distances. The hetereogeneity of the said deep layer parts may cause difficulties as regards the electrical properties of the semiconductor device, for example, difficulties as regards the insulation between adjacent islands.

It is to be noted that the diffusion rate of the impurity in the deepest parts of the layer 30 may be increased by the heterogeneity of the said parts so that it is facilitated to obtain the mutual connection between the insulating walls 33.

The interconnected insulating walls 33 separate the islands 36 completely from the substrate 38. As a result of this the choice of the substrate 38, for example, the nature of said substrate, its electrical properties, its structure and the extend in which said layer is compatible with that of the layer 30 is less critical.

In the case of electroluminescent semiconductor devices, the presence of an insulating wall between the islands 36 and the substrate 38 is of particular importance. It is known, for example, that difficulties may present themselves upon operating electroluminescent devices, due to the fact that a part of the radiation is absorbed by the substrate, while the active layer is nevertheless transparent to its own radiation. In the case in which the substrate consists of an insulating material or a semi-insulating material, that is to say a semiconductor material which shows the properties of a semi-insulating material, the absorption of the photons causes ionisation in the substrate and hence a reduction of its resistivity. In order to avoid this drawback it has been proposed to provide a strongly absorbing screening layer between the substrate and the active layer in which the electroluminescent elements are manufactured.

In the structure shown in FIG. 3 in which the electroluminescent pn junctions in the various islands 36 have been obtained in known manner at the surface of the layer 30 by localized diffusion of a suitable p-type impurity in which the zones 40 are formed, it has been found that the insulating walls 33 which are connected together in the common zones 39 form the absorbing screening layer between the islands 36 and the substrate 38. If said absorbing layer is to be very efficient, the concentration of the impurity therein should be large enough as in the whole volume of the walls 33.

Furthermore it is to be noted that the electrical connection of the various interconnected insulating walls 33 can be obtained via one contact pad 41 at the surface of one of the said walls. The contact pads 42 on the islands 36 and the contact pads 43 on the zones 40 may be provided in a manner normally used for similar devices.

An example of the realisation of a mosaic of electroluminescent diodes in a monolythic slice according to the configuration shown diagrammatically in FIG. 3 will be described hereinafter.

The substrate 38 consists, for example, of semiinsulating indiumarsenide (InAs) having a resistivity of $10^7$ ohm.cm at room temperature. Its thickness is 0.4 mm. The layer 30 consisting for the greater part of indiumarsenophosphide ($InAs_{1-x}P_x$) doped with tellurium (Te) in a concentration of $5.10^{16}$ to $3.10^{17}$ atoms/ccm, preferably $10^{17}$ atoms/ccm, is deposited by epitaxy from the vapour phase according to a known process. The thickness of said layer 30 is from 30 to 60 $\mu$m, preferably in the order of 40 $\mu$m. The deposition by epitaxy has been carried out so that the chemical formula of the said layer 30 from the substrate 38 to its surface is as follows:

InAs (preferably from 0 to 5 $\mu$m, taken from the substrate),

InAs$_{1-x}$P$_x$ with $x$ gradually increasing from 0 to 0.4 (preferably from 5 to 30 $\mu$m from the substrate), InAs$_{0.6}$P$_{0.4}$ (preferably from 30 to 40 $\mu$m from the substrate).

The insulating walls have been obtained by diffusion of zinc with a mean concentration of $10^{19}$ to $10^{20}$ atoms/ccm (preferably $5.10^{19}$ atoms/ccm), the width of the diffusion windows is 100 $\mu$m (95 to 105 $\mu$m) and their pitch is between 200 and 500 $\mu$m. Diffusion temperatures and times from 700° to 900°C and from 12 to 2 hours, resp., may be used.

The electroluminescent junctions have been obtained in a manner known as such by a short-time diffusion of zinc in the zones 40 with a mean concentration of $10^{19}$ to $10^{20}$ atoms/ccm (preferably $2.10^{19}$ atoms/ccm).

In these circumstances the connections between the walls 33 are formed at a height of 10 to 0 $\mu$m above the separation line between the substrate 38 and the layer 30.

Such a mosaic operates in the infrared.

What is claimed is:

1. A semiconductor device comprising a substrate, a monocrystalline semiconductor layer disposed on said substrate and comprising at least one semiconductor circuit element, said semiconductor layer having a first part located at the substrate side of said layer and a second part located at the surface of said layer, said first part comprising semiconductor material differing in chemical composition from that of said second part, said layer further comprising at least one region that is doped with a diffused impurity material and has a width dimension that first locally increases and then decreases in the direction from the surface of said semiconductor layer toward said substrate.

2. A semiconductor device as in claim 1, wherein said doping impurity material is characterized by a diffusion coefficient in said semconductor material of said layer that is, for a given temperature, greater at said first part than at said second part.

3. A semiconductor device as in claim 1, wherein said composition of the semiconductor material of said semiconductor layer varies gradually at least over a part of the thickness thereof.

4. A semiconductor device as in claim 1, wherein said second part has a substantially uniform composition.

5. A semiconductor device as in claim 4, wherein said second part has a certain conductivity type and comprises a zone that is present at said surface, said zone having a conductivity type opposite to that of said second part and forming a p,n junction which is present entirely within said layer second part.

6. A semiconductor device as in claim 1, wherein said first part of said layer has a substantially uniform composition.

7. A semiconductor device as in claim 6, wherein said substrate consists essentially of semiconductor material and said layer is an epitaxial layer, said layer and said substrate having substantially the same chemical composition.

8. A semiconductor device as in claim 1, wherein said substrate consists essentially of high resistivity semiconductor material.

9. A semiconductor device as in claim 1, wherein said monocrystalline semiconductor layer is divided into islands which are separated from each other by an assembly of electrically isolating walls comprising said regions, said walls having an increasing width locally in the direction from said surface toward said substrate.

10. A semiconductor device as in claim 1, wherein said regions respectively comprise juxtaposed parts that contact each other below said surface of said monocrystalline layer.

11. A semiconductor device as in claim 1, wherein said semiconductor layer consists essentially of III–V type material which is present at least partly in mixed-crystal compositions.

12. A semiconductor device as in claim 11, wherein said mixed-crystal compositions are arsenide-phosphides.

13. A semiconductor device as in claim 11, wherein said mixed-crystal composition consists essentially of indium arsenide-phosphide.

14. A semiconductor device as in claim 11, comprising at least one electroluminescent p,n junction.

15. A semiconductor device as in claim 14, wherein said semiconductor device comprises a mosaic of electroluminescent diodes.

16. A semiconductor device as in claim 1, wherein said region has a minimum width dimension at said layer surface.

17. A semiconductor device as in claim 1, wherein said region has a generally pear-shaped configuration.

18. A method of manufacturing a semiconductor device comprising the steps of providing a monocrystalline substrate, depositing an epitaxial semiconductor layer on said substrate, with the proviso that during said depositing step the composition of the depositing material is varied at least temporarily, and then locally diffusing a doping impurity from the surface of said epitaxially deposited layer at least down to a depth where the material composition of said layer varies.

19. A method as in claim 18, wherein said composition of said depositing material is gradually varied at least temporarily.

20. A method as in claim 18, wherein such variation of said deposition material is carried out to deposit a first composition in which, at a predetermined temperature, a predetermined doping impurity has a relatively large diffusion coefficient and then to deposit a second composition in which said predetermined impurity has, at said temperature, a relatively small diffusion coefficient.

* * * * *